(12) United States Patent
Sadooghi-Alvandi et al.

(10) Patent No.: US 10,303,831 B1
(45) Date of Patent: May 28, 2019

(54) METHOD AND APPARATUS FOR PERFORMING AND UTILIZING SOURCE CODE AREA ANNOTATION

(71) Applicant: Altera Corporation, San Jose, CA (US)

(72) Inventors: Maryam Sadooghi-Alvandi, Toronto (CA); Andrei Mihai Hagiescu Miriste, Toronto (CA); Alan Baker, Toronto (CA); Dmitry Nikolai Denisenko, Toronto (CA)

(73) Assignee: Altera Corporation, San Jose, CA (US)

( * ) Notice: Subject to any disclaimer, the term of this patent is extended or adjusted under 35 U.S.C. 154(b) by 108 days.

(21) Appl. No.: 14/960,329

(22) Filed: Dec. 4, 2015

Related U.S. Application Data

(60) Provisional application No. 62/208,740, filed on Aug. 23, 2015.

(51) Int. Cl.
*G06F 17/50* (2006.01)

(52) U.S. Cl.
CPC .................. *G06F 17/5045* (2013.01)

(58) Field of Classification Search
USPC ........................................... 716/102
See application file for complete search history.

(56) References Cited

U.S. PATENT DOCUMENTS

| 8,185,850 B1 * | 5/2012 | Schumacher ......... G06F 17/504 716/103 |
| 2002/0133788 A1 * | 9/2002 | Waters ..................... G06F 8/44 716/103 |

\* cited by examiner

*Primary Examiner* — Bryce M Aisaka
(74) *Attorney, Agent, or Firm* — Compass IP Law PC

(57) ABSTRACT

A method for designing a system on a target device includes generating a scheduled netlist and a hardware description language (HDL) of the system from a computer language description of the system. An area report is generated prior to HDL compilation, based on estimates from the scheduled netlist, that identifies resources from the target device required to implement portions of the computer language description of the system.

19 Claims, 10 Drawing Sheets

| Source Code | Operation | Implementation | Resources | | | |
|---|---|---|---|---|---|---|
| | | | LEs | FFs | DSPs | BRAMs |
| #define WIDTH 64 | | | | | | |
| kernel void my_kernel (global int *a, global int *b, int N) { | function | fn overhead | 250 | 300 | 0 | 0 |
| int reg[WIDTH]; | var decl | 32x64 shift register | 213 | 2048 | 0 | 0 |
| int my_const[WIDTH] = {2, 1, 23, 43, ...}; | var decl | 32x64 ROM | 48 | 32 | 0 | 1 |
| for (int i=0; i<N; i++) { | loop | loop overhead | 90 | 61 | 0 | 1 |
| for (int j=WIDTH-1; j>0; j--) reg[j-1] = reg[j]; | loop | fully unrolled | | | | |
| reg[WIDTH-1] = a[i]; | global load | streaming | 607 | 2,280 | 0 | 15 |
| int sum = 0; | | | | | | |
| for (int j=WIDTH-1; j>0; j--) | loop | Fully unrolled | | | | |
| sum += reg[j] * my_const[j]; | int mult int add ROM load | | 12 3 12 | 4 32 24 | 1 0 0 | 0 0 0 |
| b[i] = sum; | global store | streaming | 604 | 2,634 | 0 | 22 |
| }} | | | | | | |

FIG. 7

METHOD AND APPARATUS FOR PERFORMING AND UTILIZING SOURCE CODE AREA ANNOTATION

RELATED APPLICATION

This application claims benefit and priority to provisional U.S. patent application No. 62/208,740 filed Aug. 23, 2015 entitled "Method and Apparatus for Performing and Utilizing Source Code Area Annotation", the full and complete subject matter of which is hereby expressly incorporated by reference in its entirety.

FIELD

Embodiments of the present invention relate to tools for designing systems on target devices. More specifically, embodiments of the present invention relate to a method and apparatus for performing and utilizing source code area annotation.

BACKGROUND

Target devices such as field programmable gate arrays (FPGAs), application specific integrated circuits (ASICs), and structured ASICs are used to implement large systems that may include million of gates and megabits of embedded memory. The complexity of a large system often requires the use of electronic design automation (EDA) tools to create and optimize a design for the system onto physical target devices.

Among the procedures performed by EDA tools in a computer aided design (CAD) compilation flow are high-level compilation and hardware description language (HDL) compilation. EDA tools that perform high-level compilation allow designers to more quickly realize designs for systems by raising the abstraction level from traditional register transfer level (RTL) based design to a computer language description of the system.

After high-level compilation and HDL compilation, designers are able to review compiled designs for their systems to determine how resources have been allocated. If it is determined that a target device does not have sufficient resources to implement a system, a designer may modify the computer language description of the system and recompile it.

SUMMARY

According to embodiments of the present invention, a method and apparatus for performing and utilizing source code area annotation are disclosed. The source code may include a computer language description of a system that can be compiled into a hardware description language (HDL) of the system. By annotating the source code with area information that identifies resources on a target device required to implement a system and how the resources are used, designers may better identify areas of bottleneck and inefficiencies in the source code. The area information may include estimated area information generated with estimated requirements available during a high-level compilation prior to an HDL compilation or may include actual area information generated with actual requirements available after HDL compilation. Using estimated area information allows a designer to modify the source code without needing to wait for a longer HDL compilation.

According to an embodiment of the present invention, a compiler intermediate representation of a system is annotated with debug information. The debug information identifies aspects of the source code and is preserved throughout high-level compilation and/or HDL compilation. This allows the final compiler intermediate representation, HDL, and/or configuration file to be traceable to the source code. Estimated area information or actual area information may be mapped or traced back to aspects of the source code.

According to an embodiment of the present invention, a method for designing a system on a target device includes generating a scheduled netlist and a HDL of the system from a computer language description of the system, and generating an area report prior to HDL compilation, based on estimates from the scheduled netlist, that identifies resources from the target device required to implement portions of the computer language description of the system. Generating the area report may include translating the computer language description of the system to a compiler intermediate representation of the system, mapping the portions of the computer language description of the system to the compiler intermediate representation of the system, generating the scheduled netlist by performing optimizations on the compiler intermediate representation of the system, and estimating resources required from the target device to implement the scheduled netlist.

BRIEF DESCRIPTION OF THE DRAWINGS

The features and advantages of embodiments of the present invention are illustrated by way of example and are not intended to limit the scope of the embodiments of the present invention to the particular embodiments shown.

FIG. 7 illustrates an exemplary area report according to an exemplary embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, procedures, and programs are shown in block diagram form to avoid obscuring embodiments of the present invention unnecessarily.

Figure 1:
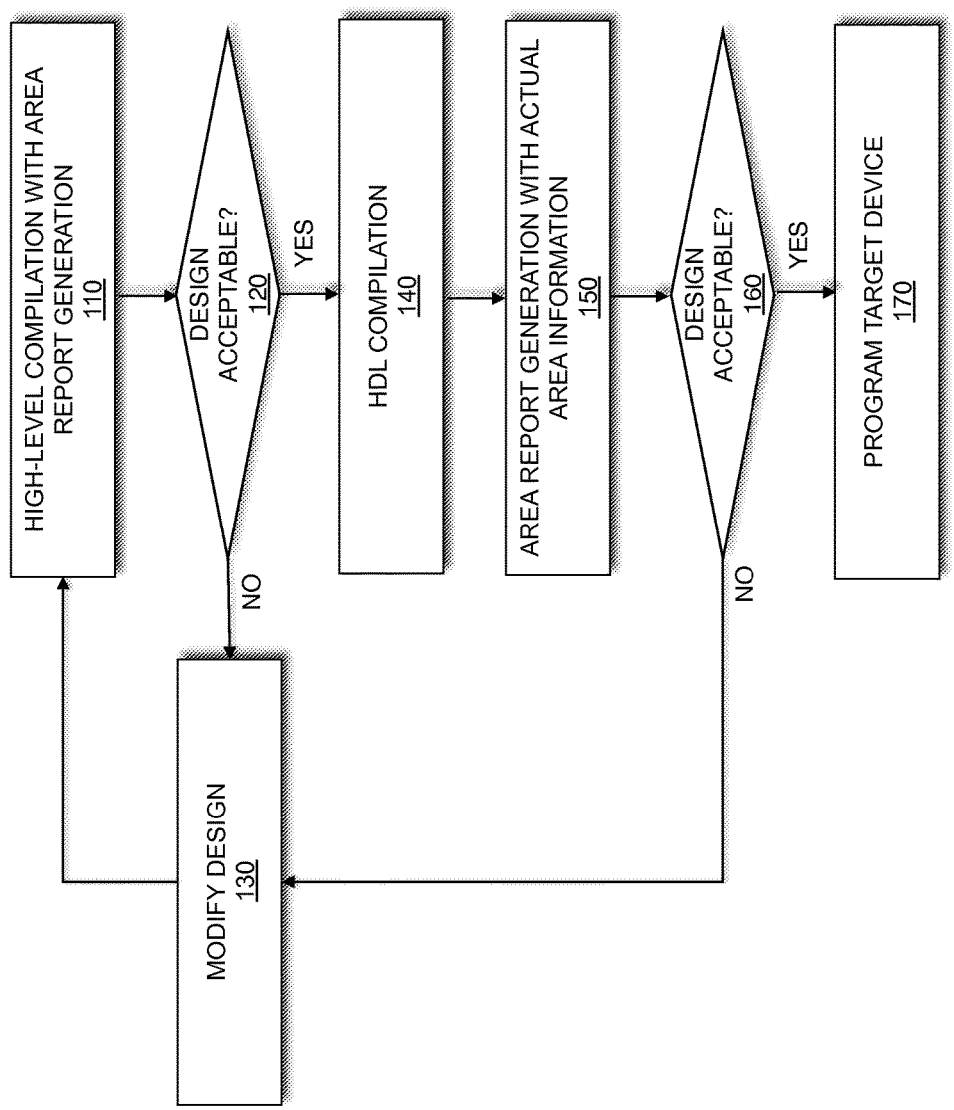
FIG. 1 is a flow chart illustrating a method for designing and implementing a system on a target device according to an exemplary embodiment of the present invention.

FIG. 1 is a flow chart illustrating a method for designing and implementing a system on a target device according to an exemplary embodiment of the present invention. The target device may be a field programmable gate array (FPGA), application specific integrated circuit (ASIC), a structured ASIC, or other device with functionality that may be described with a hardware description language (HDL). When designing a system on a target device, area usage is often a consideration. Area usage includes the utilization of resources available on the target device. An efficient usage of area allows a design on a target device to implement additional functionalities and/or operate with higher throughput. Embodiments of the present invention provide users with information to help understand how resources on a target device are used to build data paths.

According to one embodiment, the procedure illustrated in FIG. 1 may be performed by one or more computer aided design (CAD)/electronic design automation (EDA) tools implemented on a computer system. At 110, high-level compilation (or "high-level synthesis") of a design for a system is performed with area report generation. According to an embodiment of the present invention, high-level compilation involves interpreting the description of the system, which may be an algorithmic description of a desired behavior written in a computer language description, and generating a digital hardware description that implements the behavior. The computer language description may be analyzed, architecturally constrained, and scheduled to create a register transfer level (RTL) HDL of the system. The HDL of the system may integrate information regarding other components or hosts that may be pre-designed.

According to an embodiment of the present invention, an area report is generated during high-level compilation using estimated area information. The area report identifies resources from the target device required to implement specific portions of the system as described in portions of the computer language description. According to an embodiment of the present invention, the area report maps portions of the computer language description to resources required for implementing the system and identifies how the resources are implemented. Each portion of the portions of the computer language description of the system may include, for example, a block of code representing an individual kernel, an individual function, or line of code.

At 120, it is determined whether the design is acceptable. According to an embodiment of the present invention, a design may be acceptable if the area report indicates that sufficient resources are available on the target device to implement the design. A determination that a design is acceptable may be made automatically by a CAD/EDA tool. Alternatively, the determination may be made in response to a review by a user. If the design is not determined to be acceptable, control proceeds to 130. If the design is determined to be acceptable, control proceeds to 140.

At 130, the design is modified. The design may be modified by changing the computer language description of the system to address issues identified in the area report. According to an embodiment of the present invention, the design modification may be performed automatically by a CAD/EDA tool. Alternatively, the design modification may be made by a user or in response to a user specification. By using the area report generated at 110 with estimated area information, a user/design tool may modify a design in response to information regarding resource allocation without needing to wait for HDL compilation to be completed. This reduces design time which is desirable.

At 140, HDL compilation is performed. HDL compilation involves performing synthesis, placement, routing, and timing analysis on the HDL of the system onto a designated target device and generating a program ("configuration") file for the target device.

At 150, an area report is generated with actual area information. The actual area information is obtained from results of the HDL compilation. The area report identifies resources from the target device required to implement specific portions of the system as described in portions of the computer language description. According to an embodiment of the present invention, the area report maps portions of the computer language description to resources required for implementing the system and identifies how the resources are implemented.

At 160, it is determined whether the design is acceptable. According to an embodiment of the present invention, a design may be acceptable if the area report indicates that sufficient resources are available on the target device to implement the design. A determination that a design is acceptable may be made automatically by a CAD/EDA tool. Alternatively, the determination may be made in response to a review by a user. If the design is not determined to be acceptable, control proceeds to 130. If the design is determined to be acceptable, control proceeds to 170.

At 170, the target device is programmed using the configuration file to implement the system. According to an embodiment of the present invention, the configuration file may be generated and transmitted to another computer system that may be used to program the target device according to the system design. By programming the target with the configuration file, components on the target device are physically transformed to implement the system.

Figure 2:
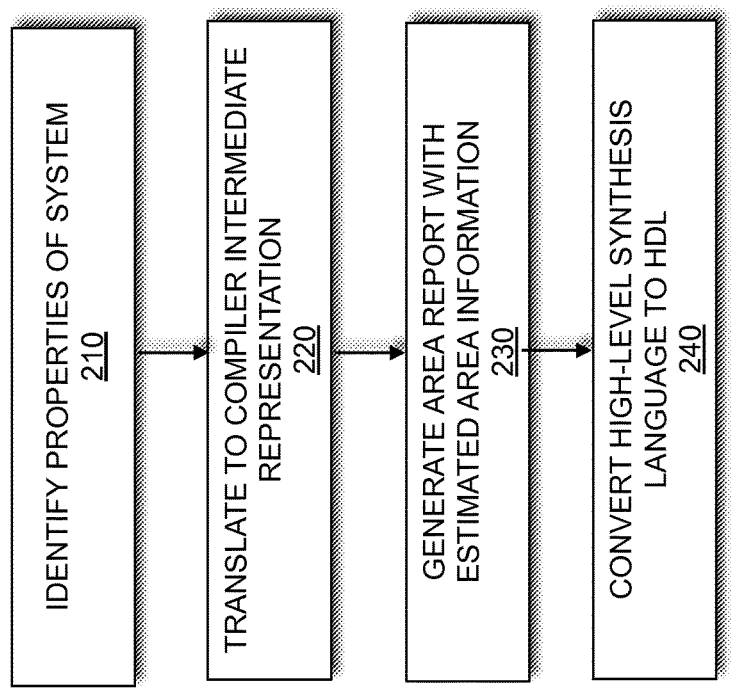
FIG. 2 is a flow chart illustrating a method for performing high-level compilation with area report generation according to an exemplary embodiment of the present invention.

FIG. 2 is a flow chart illustrating a method for performing high-level compilation of a system with area report generation according to an embodiment of the present invention. According to an embodiment of the present invention, the procedures shown in FIG. 2 may be used to implement procedure 110 (shown in FIG. 1). At 210, properties of the system are identified. According to an embodiment of the present invention, the properties of the system may include functions and algorithms performed by the system by one or more compute devices, and may be identified from a computer language description of the system. The computer language description of the system may be, for example, in an Open Computing Language (OpenCL) format or another computer language description format that provides a framework for writing programs that execute across heterogeneous platforms. The computer language description format may be used for writing kernels and application programming interfaces (APIs) that are used to define and control platforms. According to an embodiment of the present invention, the properties of the system may be referred to as kernel code.

At 220, the kernel code is translated to compiler intermediate representation. According to an embodiment of the present invention, the compiler intermediate representation of the kernel code includes a sequence of functions. Each function is a sequence of instructions grouped into basic blocks. A basic block is a contiguous sequence of instructions with one entry point and one exit point. An instruction in the middle of a basic block may be a function call, but may not count as an exit point from the basic block. Each basic block terminates with either (1) branch (possibly conditional), or (2) a return from the function. The kernel code may also include a system description of the hardware target system which it is to be implemented on.

At 230, an area report is generated with estimated area information. According to an embodiment of the present invention, the area report includes estimated area information mapped to corresponding portions of the computer language description of the system. The estimated area information describes resource utilization that is estimated from a scheduled netlist generated from an optimized compiler intermediate representation.

At 240, HDL is generated for the design of the system. The HDL describes the operation of the system to be programmed on the target device. The HDL description provides high-level representations of a circuit in terms of the flow of signals (or transfer of data) between hardware registers, and the logic operations performed on those signals.

Figure 3:
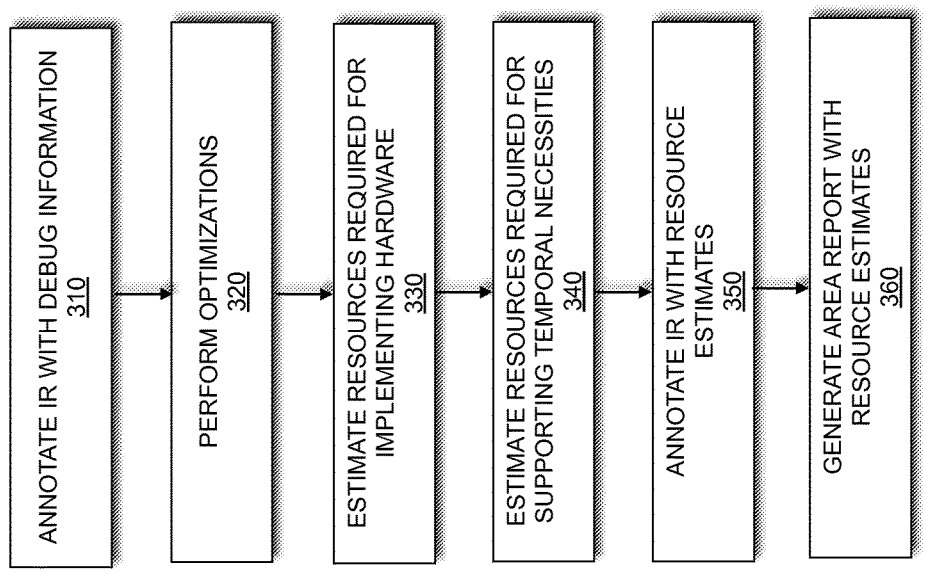
FIG. 3 is a flow chart illustrating a method for generating an area report with estimated area information according to an exemplary embodiment of the present invention.

FIG. 3 is a flow chart illustrating a method for generating an area report with estimated area information according to an exemplary embodiment of the present invention. According to an embodiment of the present invention, the procedures shown in FIG. 3 may be used to implement procedure 230 (shown in FIG. 2). At 310, a compiler intermediate representation (IR) is annotated with debug information. According to an embodiment of the present invention, the debug information identifies corresponding portions or aspects of a computer language description of a system which a portion of a compiler intermediate representation is based on. The debug information may include a file name, line number, column, or variable name corresponding to a computer language description of the system. The debug information may also include actual lines of code from the computer language description. According to an embodiment of the present invention, annotating the compiler intermediate representation with the debug information links specific portions of the compiler intermediate representation with its corresponding debug information throughout the flow described in FIG. 3. This allows any optimization and estimation associated with any particular portion of the compiler intermediate representation to be associated with a corresponding portion of the computer language description of the system as identified in the debug information.

At 320, optimizations are performed on the compiler intermediate representation. According to an embodiment of the present invention, an appropriate set of optimizations are applied to improve throughput based on the properties of the system and type of target device which the system is to be implemented on. The optimizations applied may include parallelism expansion, external channel fan-out minimization, data buffering, latency reduction, control flow simplification, functional unit merging, and/or other optimizations.

At 330, resources required for implementing hardware are estimated. According to an embodiment of the present invention, each operation and instruction in the computer language description is examined for the estimation. Models may be applied to identify specific resources from the target device to implement the hardware needed for the operations and instructions in the computer language description. The models may include functional models built and refined using actual hardware synthesis during an earlier compilation.

At 340, resources required for supporting temporal necessities are estimated. According to an embodiment of the present invention, pipeline scheduling is performed on the data to be processed on the hardware. Additional resources such as registers and first-in-first-outs (FIFOs) may be utilized to support pipeline scheduling for the system. As with the resources estimated at 330, different models may be utilized to select an appropriate FIFO implementation that supports an appropriate size of data.

According to an embodiment of the present invention, a control data flow graph may be generated from the compiler intermediate representation. Each node in the control data flow graph may represent an operation or a temporal resource. The control data flow graph may be used to perform pipeline scheduling.

At 350, the compiler intermediate representation is annotated with the resource estimates from 330 and 340. This allows the resource estimations to be linked to the portions of the computer language description of the system through the annotated debug information.

At 360, an area report is generated from the resource estimates. According to an embodiment of the present invention, the area report identifies specific portions of the computer language description of the system, as specified in the debug information, and resource estimates associated with each portion.

Figure 4:
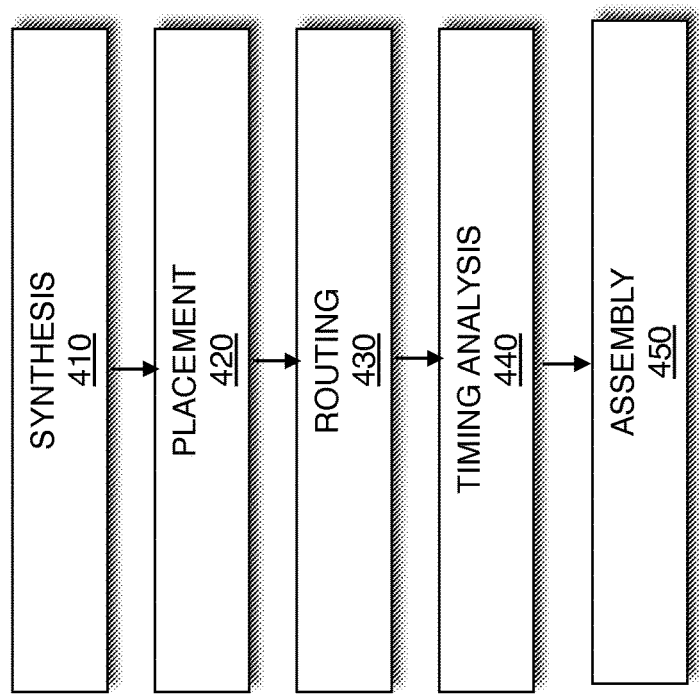
FIG. 4 is a flow chart illustrating a method for performing hardware description language compilation according to an exemplary embodiment of the present invention.

FIG. 4 is a flow chart illustrating a method for performing HDL compilation according to an embodiment of the present invention. The procedures illustrated in FIG. 4 may be used to implement procedure 140 (shown in FIG. 1). According to an embodiment of the present invention, the HDL compiled in FIG. 4 is annotated with debug information. As described with reference to FIG. 3, the debug information identifies corresponding portions or aspects of a computer language description of a system which a portion of the HDL is based on. Annotating the HDL with the debug information links specific portions of the HDL with its corresponding debug information throughout the flow described in FIG. 4. This allows portions of the configuration file generated from HDL compilation to be associated with a corresponding portion of the computer language description of the system as identified in the debug information.

At 410, the system is synthesized. Synthesis includes generating a logic design of the system to be implemented by the target device. According to an embodiment of the present invention, synthesis generates an optimized logical representation of the system from an HDL design definition. Synthesis also includes mapping the optimized logic design. Mapping includes determining how to implement logic gates and logic elements in the optimized logic representation with specific resources on the target device such as logic elements and functional blocks. According to an embodiment of the present invention, a netlist is generated from mapping. This netlist may be an optimized technology-mapped netlist generated from the HDL.

At 420, the system is placed. According to an embodiment of the present invention, placement involves placing the mapped logical system design on the target device. Placement works on the technology-mapped netlist to produce a placement for each of the logic elements and functional blocks. According to an embodiment of the present invention, placement includes fitting the system on the target device by determining which resources on the target device are to be used to implement the logic elements and functional blocks identified during synthesis. Placement may include clustering which involves grouping logic elements together to form the logic clusters present on the target device. According to an embodiment of the present invention, clustering is performed at an early stage of placement and occurs directly after synthesis during the placement preparation stage.

At 430, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 440, timing analysis is performed on the system designed by procedures 410, 420, and 430. According to an embodiment of the present invention, the timing analysis determines whether timing constraints of the system are satisfied.

At 450, an assembly procedure is performed. The assembly procedure involves creating a configuration file that includes information determined by the procedures described at 410, 420, 430, and 440. The configuration file may be a bit stream that may be used to program a target device. According to an embodiment of the present invention, the procedures illustrated in FIG. 4 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. By programming the target with the configuration file, components on the target device are physically transformed to implement the system.

Figure 5:
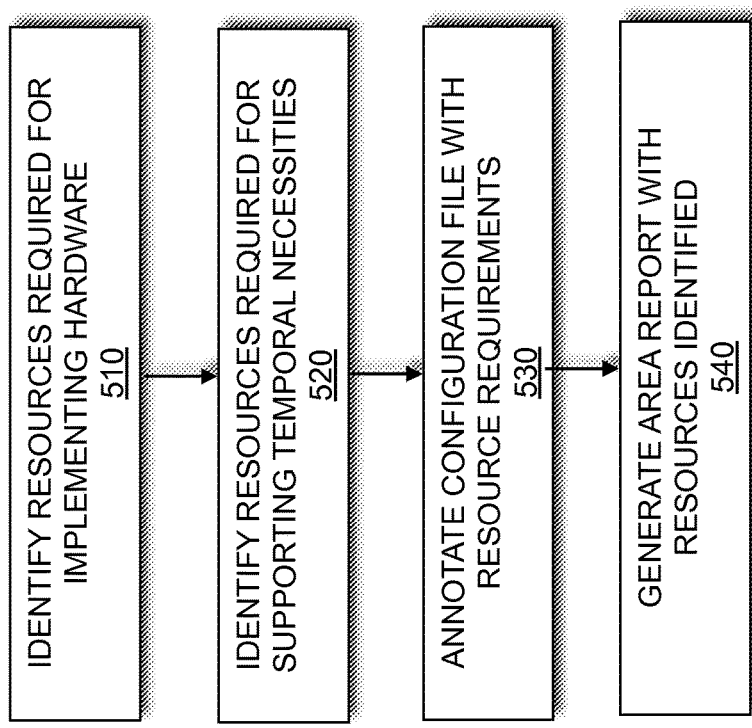
FIG. 5 is a flow chart illustrating a method for generating an area report with actual area information according to an exemplary embodiment of the present invention.

FIG. 5 is a flow chart illustrating a method for generating an area report with actual area information according to an exemplary embodiment of the present invention. The procedures shown in FIG. 5 may be used to implement procedure 150 (shown in FIG. 1). At 510, resources required for implementing hardware are identified. According to an embodiment of the present invention, a configuration file that includes synthesis, placement, and routing results from HDL compilation is used to identify the actual hardware requirements for implementing operations and instructions in the computer language description referenced in debug information.

At 520, resources required for supporting temporal necessities are identified. According to an embodiment of the present invention, pipeline scheduling is performed prior to generation of the HDL. In this embodiment, the temporal resources required are extracted from actual area information from the HDL. These may include resources such as registers and first-in-first-outs (FIFOs) that are utilized to support pipeline scheduling for the system.

According to an embodiment of the present invention, a control data flow graph may be generated. Each node in the control data flow graph may represent an operation or instruction from the computer language description of the system. The control data flow graph may be used to perform pipeline scheduling.

At 530, the configuration file is annotated with the resources identified from 510 and 520. This allows the identified resources to be linked to the portions of the computer language description of the system through the annotated debug information.

At 540, an area report is generated from the resources identified. According to an embodiment of the present invention, the area report identifies specific portions of the computer language description of the system, as specified in the debug information, and the resources identified to implement each of the associated portions.

FIGS. 1-5 are flow charts that illustrate embodiments of the present invention. The procedures described in these figures may be performed by an EDA tool implemented by a computer system. Some of the techniques illustrated may be performed sequentially, in parallel or in an order other than that which is described, and the procedures described may be repeated. It is appreciated that not all of the techniques described are required to be performed, that additional techniques may be added, and that some of the illustrated techniques may be substituted with other techniques.

Figure 6:
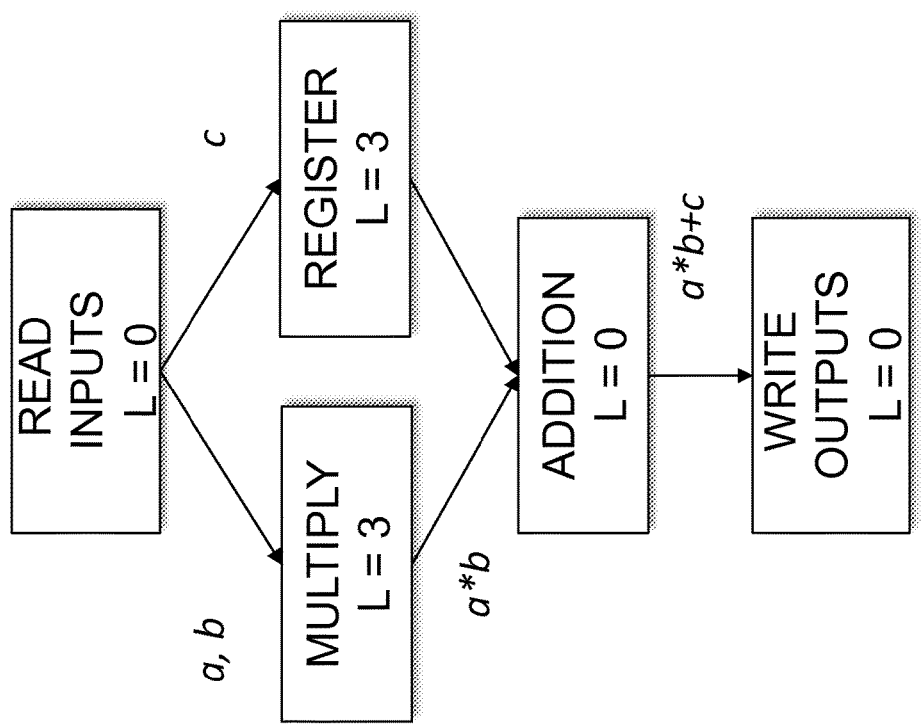
FIG. 6 illustrates an exemplary control data flow graph that is used to identify resources required for implementing a portion of a computer language description of a system according to an exemplary embodiment of the present invention.

FIG. 6 illustrates an exemplary control data flow graph that may be used to identify resources required for implementing a portion of a computer language description of a system according to an exemplary embodiment of the present invention. In this example, a portion of a computer language description of the system states the following.

int dotproduct(int a, int b, int c)
{
return (a*b)+c;
}

After the portion of the computer language description of the system is transformed into compiler intermediate representation, the control data flow graph illustrated in FIG. 6 may be generated to represent the portion of the system. Paths represented by arrows in the control data flow graph indicate data and control flow dependencies. For example, an arrow may represent a requirement that a valid value from a node at a tail of an arrow is necessary for a node to proceed. Latency in the control data flow graph is specified with the variable L.

As shown in the example in FIG. 6, registers may be used to balance the latency for the "c" path to the latency of the "a" and "b" path to improve throughput. According to an embodiment of the present invention, all nodes except for the REGISTER node are operations to perform a computation. The REGISTER node represents temporal resources used to carry data along a pipeline. The MULTIPLY node represents a multiplication in the source code. In the illustrated embodiment, it takes three cycles to produce an output from the MULTIPLY node, however, all of the inputs (a, b, and c from the source code) are produced at the same point. The "c" path is pipelined with three registers so that its latency into the "add" node is matched to the latency of the "a" and "b" path.

FIG. 7 illustrates an exemplary area report according to an exemplary embodiment of the present invention. The area report may be generated during high-level compilation 110 and after HDL compilation 140 at area report generation 150 as shown in FIG. 1. According to an embodiment of the present invention, the area report presents debug information or data derived from debug information, and its corresponding area information. The debug information describes aspects of source code or a computer level description of a system which may be of interest. The debug information may include a kernel name, file name, line number or column number, a variable name, an operator, or other identifier of a portion of a computer language description of the system. The debug information may also include actual lines of code from the computer language description that specifies a statement or expression. As shown in FIG. 7, the debug information is listed under the column labeled "Source Code" and includes lines of code from a computer language description of a system.

The area report also includes area information which identifies resources required for implementing the portion of computer language description of the system of interest, and how the resources are used. As described with reference to FIGS. 1-5, the area information may be derived from estimates during high-level compilation or from actual results after HDL compilation. It should be appreciated that a variety of different types of area information may be presented. For example, the area information may identify resource types that are required, such as logic elements, flip-flops, random access memories, and digital signal processors. The area information may provide a comparison of categories of resources that are required, such as datapath resources vs. memory resources, control resources vs. data resources, on-chip resources vs. off-chip resources. The area information may also identify how resources are used by identifying an operation and implementation of the resource. As shown in FIG. 7, the area information is listed under the columns "Resources", "Operation", and "Implementation". The area information under the "Resource" column indicates the number of LEs, FFs, DSPs, and BRAMs required to implement a portion of computer language description of a system. The area information under the "Operation" and "Implementation" columns describes how the resources are used and the manner the resources are used.

Figure 8:
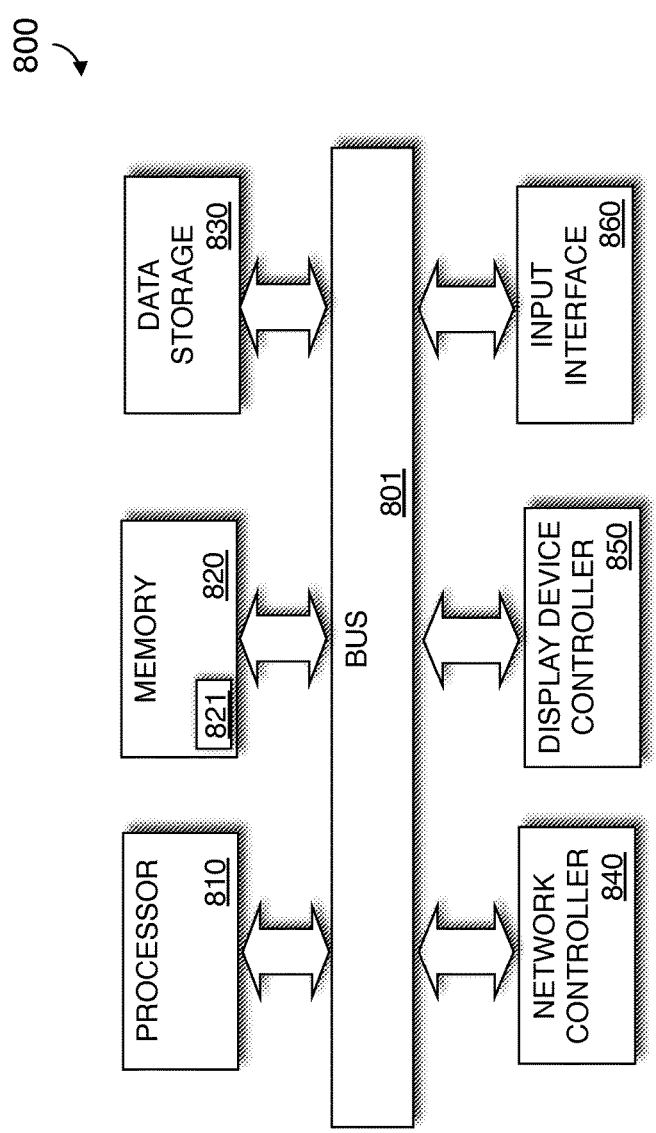
FIG. 8 is a block diagram of a computer system implementing a system designer according to an exemplary embodiment of the present invention.

FIG. 8 is a block diagram of an exemplary computer system 800 in which an example embodiment of the present invention resides. The computer system 800 includes a processor 810 that process data signals. The processor 810 is coupled to a bus 801 or other switch fabric that transmits data signals between processor 810 and other components in the computer system 800. The computer system 800 includes a memory 820. The memory 820 may store instructions and code represented by data signals that may be executed by the processor 810. A data storage device 830 is also coupled to the bus 801.

A network controller 840 is coupled to the bus 801. The network controller 840 may link the computer system 800 to a network of computers (not shown) and supports communication among the machines. A display device controller 850 is coupled to the bus 801. The display device controller 850 allows coupling of a display device (not shown) to the computer system 800 and acts as an interface between the display device and the computer system 800. An input interface 860 is coupled to the bus 801. The input interface 860 allows coupling of an input device (not shown) to the computer system 800 and transmits data signals from the input device to the computer system 800.

A system designer 821 may reside in the memory 820 and be executed by the processor 810. The system designer 821 may operate to perform high-level compilation, HDL compilation, area report generation, modification of a computer language description of a system, and programming a target device. According to an embodiment of the present invention, the system designer 821 may implement the procedures described with reference to FIGS. 1-5.

Figure 9:
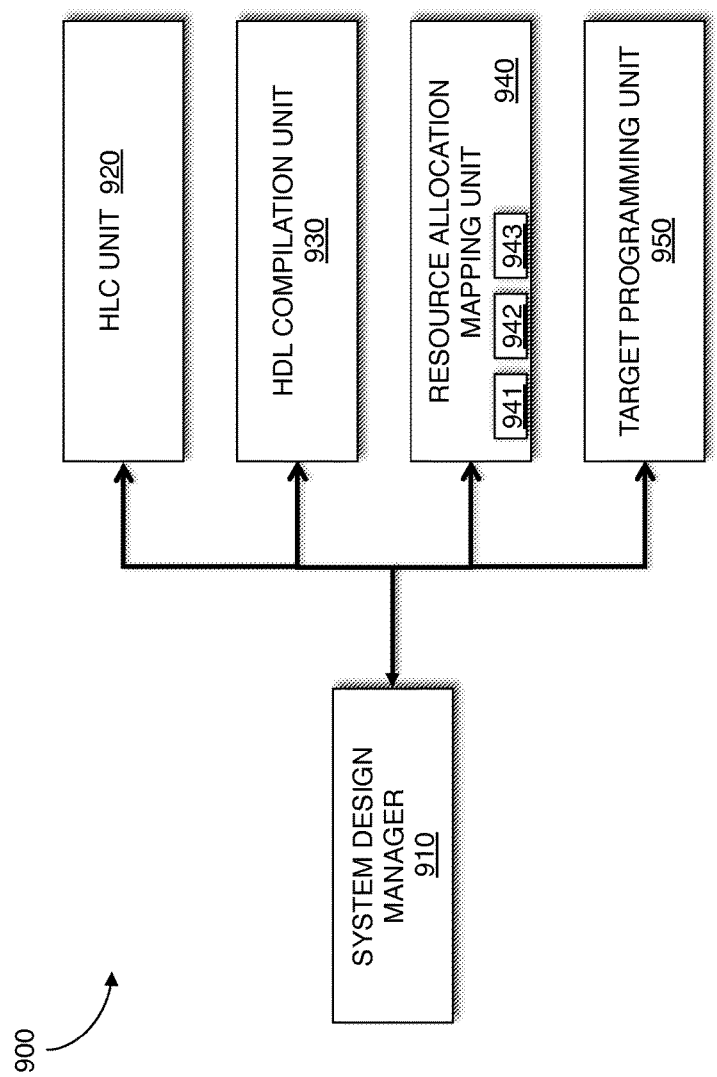
FIG. 9 is a block diagram of a system designer according to an exemplary embodiment of the present invention.

FIG. 9 illustrates a system designer 900 according to an embodiment of the present invention. The system designer 900 may be an EDA tool for designing a system on a target device such as an FPGA, structured application-specific integrated circuit (ASIC), ASIC, or other circuitry. FIG. 9 illustrates modules implementing an embodiment of the system designer 900. According to one embodiment, the modules represent software modules and system design may be performed by a computer system such as the one illustrated in FIG. 8 executing sequences of instructions represented by the modules shown in FIG. 9. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software. The system designer 900 includes a system design manager 910. The system design manager 910 is connected to and transmits data between the components of the system designer 900.

The system designer 900 includes a high-level compilation (HLC) unit 920. The high-level compilation unit 920 generates an HDL of a system from a computer language description of the system. According to an embodiment of the present invention, the high-level compilation unit 920 interprets a description of the system, which may be an algorithmic description of a desired behavior written in a computer language description, and generates a digital hardware description that implements the behavior. The computer language description may be analyzed, architecturally constrained, and scheduled to create a register transfer level (RTL) HDL of the system. The HDL of the system may integrate information regarding other components or hosts that may be pre-designed. According to an embodiment of the present invention, the high-level compilation unit 920 may perform procedures described with reference to FIGS. 2 and 3.

The system designer 900 includes a hardware description language (HDL) compilation unit 930. The hardware description language compilation unit 930 performs synthesis, placement, routing, and timing analysis on the HDL and generates a configuration file. According to an embodiment of the present invention, the hardware description language compilation unit 930 may perform procedures described with reference to FIG. 4.

The system designer 900 includes a resource allocation mapping unit 940. The resource allocation mapping unit 940 uses estimated area information from the high-level compilation unit 920 or actual area information from the HDL compilation unit 930 to generate an area report that identifies resources from the target device required to implement specific portions of the system as described in portions of the computer language description. According to an embodiment of the present invention, the area report maps portions of the computer language description to resources required for implementing the system and identifies how the resources are implemented.

The resource allocation mapping unit 940 includes an annotation unit 941. The annotation unit 941 annotates or attaches debug information to corresponding portions of compiler intermediate representation of the system. The debug information identifies aspects of a computer language description of a system which portions of the compiler intermediate representation is based on or derived from. According to an embodiment of the present invention, annotating the compiler intermediate representation with the debug information links specific portions of the compiler intermediate representation with its corresponding debug information. This allows any optimization and estimation of any portion of the compiler intermediate representation to be associated with its corresponding portion of the computer language description of the system. The annotation unit 941 may also annotate or attach debug information to corresponding portions of HDL. Annotating the HDL with debug information links specific portions of the HDL with its corresponding debug information. This allows portions of compiled HDL in a configuration file to be associated with a corresponding portion of the computer language description of the system as identified in the debug information.

The resource allocation mapping unit 940 includes a resource allocation unit 942. The resource allocation unit 942 identifies resources required to implement portions of the computer language description of the system as identified in the debug information. This may be referred to as "area information". According to an embodiment of the present invention, the resources required may be identified from estimated area information from the high-level compilation unit 920 or actual area information from the HDL compilation unit 930. The identified resources include resources for implementing the hardware and for supporting temporal necessities such as pipelining data.

The annotation unit 941 may annotate or attach the area information to corresponding portions of a compiler intermediate language or configuration file. This allows the area information to be linked to the appropriate portion of the computer language description of the system.

The resource allocation mapping unit 940 includes an area report generation unit 943. The area report generation unit 943 generates an area report that identifies resources from the target device required to implement specific portions of the system as described in portions of the computer language description. The area report generation unit 943 utilizes the annotations connecting portions of a computer level description of a system to portions of a compiler intermediate representation/configuration file, and the annotations connecting area information to the intermediate representation/configuration file to generate the area report. According to an embodiment of the present invention, the resource allocation mapping unit 940 may perform procedures described with reference to FIGS. 3 and 5.

It should be appreciated that the system design manager 910 may modify the computer language description of the system to address issues identified in the area report. According to an embodiment of the present invention, the design modification may be performed automatically by the system design manager 910. Alternatively, the design modification may be made by a user or in response to a user specification.

The system designer 900 includes a target programming unit 950. The target programming unit 950 programs a target device using the configuration file to implement the system. By programming the target device with the configuration file, components on the target device are physically transformed to implement the system.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 10:
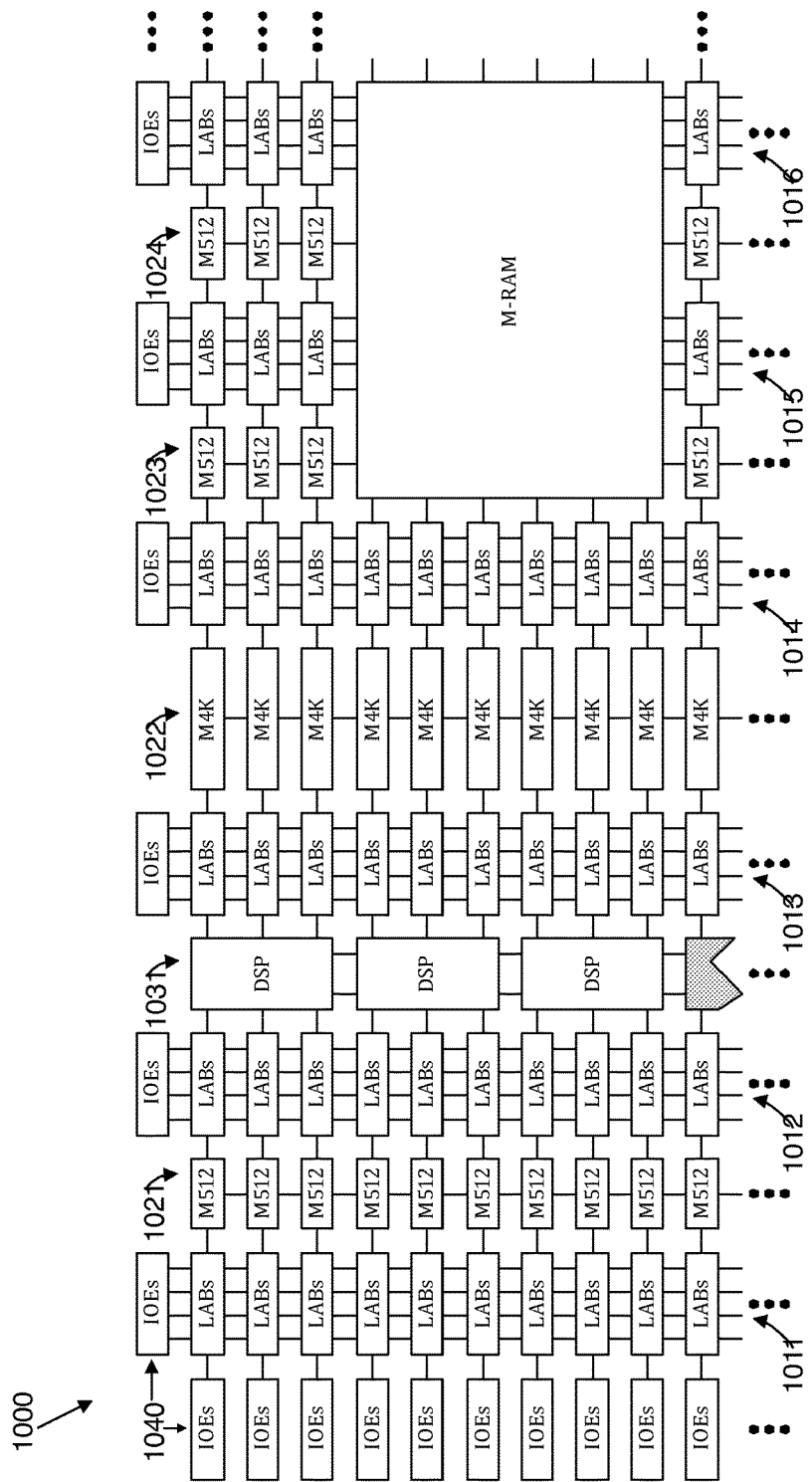
FIG. 10 illustrates an exemplary target device according to an exemplary embodiment of the present invention.

FIG. 10 illustrates a device 1000 that may be used to implement a target device according to an embodiment of the present invention. The device 1000 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 1000. Columns of LABs are shown as 1011-1016. It should be appreciated that the logic block may include additional or alternate components.

The device 1000 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1000. Columns of memory blocks are shown as 1021-1024.

The device 1000 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1000 and are shown as 1031.

The device 1000 includes a plurality of input/output elements (IOEs) 1040. Each IOE feeds an IO pin (not shown) on the device 1000. The IOEs 1040 are located at the end of LAB rows and columns around the periphery of the device 1000. Each IOE may include a bidirectional IO buffer and a plurality of registers for registering input, output, and output-enable signals.

The device 1000 may include routing resources such as LAB local interconnect lines, row interconnect lines ("H-type wires"), and column interconnect lines ("V-type wires") (not shown) to route signals between components on the target device.

The components and routing resources on the target device 1000 may be programmed to implement custom memory interfaces that access different memory systems on and off the target device 1000. The custom memory interfaces may be designed to work together with the unique properties of the memory systems in order to efficiently utilize area, power, and resources on the target device, and to increase performance.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
    generating a scheduled netlist and a hardware description language (HDL) of the system from a computer language description of the system;
    generating an area report prior to HDL compilation, based on estimates from the scheduled netlist, that identifies resources from the target device required to implement specific operations from portions of the computer language description of the system and that identifies how the resources are used on the target device;
    generating a configuration file for the system for physically transforming components on the target device to implement the system;
    generating another area report, based on actual requirements from the configuration file, that identifies resources from the target device required to implement portions of the computer language description of the system; and
    physically transforming components on the target device to implement the system using the configuration file.

2. The method of claim 1, wherein generating the area report comprises:
    translating the computer language description of the system to a compiler intermediate representation of the system;
    annotating debug information to corresponding portions of the compiler intermediate representation of the system;
    performing optimizations on the compiler intermediate representation of the system; and
    estimating resources required from the target device to implement the scheduled netlist.

3. The method of claim 2, wherein the debug information identifies aspects of the computer language description of the system.

4. The method of claim 2, wherein estimating the resources required from the target device to implement the scheduled netlist comprises accounting for hardware in the scheduled netlist and accounting for pipelining of data.

5. The method of claim 1, wherein each portion of the portions of the computer language description of the system is a block of code representing an individual kernel.

6. The method of claim 1, wherein each portion of the portions of the computer language description of the system is a block of code representing an individual function.

7. The method of claim 1, wherein each portion of the portions of the computer language description of the system is an individual line of code.

8. The method of claim 1 further comprising:
    presenting the area report to a user;
    modifying the computer language description of the system, after the area report is presented to the user, in response to input provided by the user; and
    generating another hardware description language (HDL) of the system from the computer language description of the system that has been modified.

9. The method of claim 1 further comprising programming the target device with a modified configuration file to physically transform the components on the target device to implement the system.

10. The method of claim 1, wherein generating the area report comprises:
    translating the computer language description of the system to a compiler intermediate representation of the system;
    mapping portions of the computer language description of the system to corresponding portions of the compiler intermediate representation of the system;
    performing optimizations on the compiler intermediate representation of the system; and
    estimating resources required to implement portions of the computer language description from the scheduled netlist.

11. The method of claim 10, wherein the method further comprises identifying how the resources are utilized in the system from the scheduled netlist.

12. The method of claim 10, wherein estimating the resources required comprises accounting for hardware in the scheduled netlist and accounting for pipelining of data.

13. The method of claim 10, wherein estimating the resources required comprises:
    generating a control data flow graph from the scheduled netlist, wherein nodes in the control data flow graph represent instructions in the computer language description of the system;
    scheduling the control data flow graph to determine when instructions are executed;
    adding nodes on the control data flow graph to support pipelining; and
    identify resources required for each of the nodes.

14. The method of claim 10, wherein the resources estimated to be required to implement portions of the computer language description of the system are identified with reference to resource type.

15. The method of claim 10, wherein each portion of the portions of the computer language description of the system is a block of code representing an individual function.

16. The method of claim 10, wherein each portion of the portions of the computer language description of the system is an individual line of code.

17. A system designer, comprising:
    a high-level compilation unit that generates a scheduled netlist and a hardware description language (HDL) for a system from a computer language description of the system;
    a resource allocation mapping unit that generates an area report prior to HDL compilation, based on estimates from the scheduled netlist, that identifies resources from a target device required to implement portions of the computer language description of the system, and that identifies how the resources identified operate and are implement functions on the target device;
    an HDL compilation unit that generates a configuration file for the system for physically transforming components on the target device to implement the system, wherein the resource allocation mapping unit generates another area report, based on actual requirements from the configuration file, that identifies resources from the target device required to implement portions of the computer language description of the system; and a target programming unit that physically transforms components on the target device to implement the system using the configuration file.

18. The system designer of claim 17, wherein each portion of the portions of the computer language description of the system is an individual line of code.

19. A non-transitory computer readable medium including a sequence of instructions stored thereon for causing a computer to execute a method for designing a system on a target device, comprising:

generating an area report prior to hardware description language (HDL) compilation, based on estimates from a scheduled netlist, that identifies resources from the target device required to implement portions of a computer language description of the system and that identifies how the resources are used on the target device;

generating a configuration file for the system from an HDL of the system;

generating another area report, based on actual requirements from the configuration file, that identifies resources from the target device required to implement portions of the computer language description of the system; and physically transforming components on the target device to implement the system using one of the configuration file and a modified configuration file.

* * * * *